(12) United States Patent
Ouzillou

(10) Patent No.: US 8,467,827 B2
(45) Date of Patent: Jun. 18, 2013

(54) TECHNIQUES FOR PARTITIONING RADIOS IN WIRELESS COMMUNICATION SYSTEMS

(75) Inventor: Mendy M. Ouzillou, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 0 days.

(21) Appl. No.: 11/096,255

(22) Filed: Mar. 31, 2005

(65) Prior Publication Data

US 2006/0223577 A1 Oct. 5, 2006

(51) Int. Cl.
*H04M 1/00* (2006.01)

(52) U.S. Cl.
USPC ...................................... 455/552.1

(58) Field of Classification Search
USPC ............... 455/556.1, 82, 333, 41.2, 90.2, 78, 455/553; 250/336.1; 257/533, 734, 700; 330/310; 343/700, 705; 333/193, 246; 370/310
See application file for complete search history.

(56) References Cited

U.S. PATENT DOCUMENTS

| | | | |
|---|---|---|---|
| 5,198,824 A | 3/1993 | Poradish | |
| 5,355,524 A * | 10/1994 | Higgins, Jr. | 455/82 |
| 5,982,250 A * | 11/1999 | Hung et al. | 333/26 |
| 6,075,995 A * | 6/2000 | Jensen | 455/552.1 |
| 6,249,254 B1 | 6/2001 | Bateman et al. | |
| 6,452,565 B1 | 9/2002 | Kingsley et al. | |
| 6,480,699 B1 * | 11/2002 | Lovoi | 455/41.2 |
| 6,580,402 B2 * | 6/2003 | Navarro et al. | 343/853 |
| 6,718,163 B2 * | 4/2004 | Tandy | 455/90.2 |
| 6,768,454 B2 | 7/2004 | Kingsley et al. | |
| 6,815,739 B2 | 11/2004 | Huff et al. | |
| 6,816,118 B2 | 11/2004 | Kingley et al. | |
| 6,906,411 B1 * | 6/2005 | Katsura et al. | 257/700 |
| 7,023,390 B1 * | 4/2006 | Kim et al. | 343/705 |
| 7,049,906 B2 | 5/2006 | Wilcox | |
| 7,088,964 B2 | 8/2006 | O | |
| 7,119,745 B2 | 10/2006 | Gaucher et al. | |
| 7,155,252 B2 | 12/2006 | Martin et al. | |
| 7,239,855 B2 | 7/2007 | Matsui et al. | |
| 7,379,751 B2 | 5/2008 | Wada et al. | |
| 7,444,734 B2 * | 11/2008 | Gaucher et al. | 29/600 |
| 2002/0044030 A1 * | 4/2002 | Uchikoba | 333/193 |
| 2002/0049042 A1 | 4/2002 | Oida et al. | |
| 2002/0093456 A1 | 7/2002 | Sawamura et al. | |
| 2003/0016176 A1 | 1/2003 | Kingley et al. | |
| 2003/0122638 A1 * | 7/2003 | Tarui et al. | 333/246 |
| 2003/0151548 A1 | 8/2003 | Kingley et al. | |
| 2003/0184478 A1 | 10/2003 | Kingley et al. | |
| 2003/0190895 A1 * | 10/2003 | Mostov et al. | 455/78 |

(Continued)

FOREIGN PATENT DOCUMENTS

EP 1311072 5/2003

OTHER PUBLICATIONS

Johnson, Colin, "Antenna Design Boosts Efficiency Per Given Size," EE Times, Issue 1325, p. 55, Jun. 14, 2004.

*Primary Examiner* — Kiet Doan
(74) *Attorney, Agent, or Firm* — McKee, Voorhees & Sease, P.L.C.

(57) ABSTRACT

A method and apparatus is provided for partitioning a radio using a multi-chip module to group some or all of the components of the radio in a single package. In one example, a radio uses a multi-chip module, including a chip carrier. Various components of the radio reside in integrated circuits that are mounted to the chip carrier. If desired, one or more antennas can be integrated into the chip carrier.

22 Claims, 4 Drawing Sheets

U.S. PATENT DOCUMENTS

| | | |
|---|---|---|
| 2004/0110481 A1 | 6/2004 | Navsariwala |
| 2004/0124928 A1* | 7/2004 | Karasudani .................. 330/310 |
| 2004/0155817 A1 | 8/2004 | Kingley et al. |
| 2004/0217472 A1* | 11/2004 | Aisenbrey et al. ............ 257/734 |
| 2005/0026647 A1 | 2/2005 | Li et al. |
| 2005/0079851 A1* | 4/2005 | Derbyshire et al. .......... 455/333 |
| 2005/0094584 A1* | 5/2005 | Kluge et al. .................. 370/310 |
| 2005/0122265 A1* | 6/2005 | Gaucher et al. ........ 343/700 MS |
| 2006/0028378 A1 | 2/2006 | Gaucher et al. |
| 2006/0121865 A1 | 6/2006 | Frank et al. |
| 2006/0160564 A1 | 7/2006 | Beamish et al. |

* cited by examiner

TECHNIQUES FOR PARTITIONING RADIOS IN WIRELESS COMMUNICATION SYSTEMS

FIELD OF THE INVENTION

This invention relates to the field of wireless communications. In particular, this invention is drawn to techniques for partitioning radios in wireless communication systems.

BACKGROUND OF THE INVENTION

As wireless devices, such as cellular telephones, have become more integrated, proper hardware partitioning becomes increasingly important. Generally, when designing a radio, a designer will partition the radio into functional and hardware blocks. For example, a typical radio may be partitioned as follows. A transceiver is formed on an integrated circuit (IC), and is mounted on a printed circuit board (PCB). A power amplifier is also formed on an integrated circuit, which is mounted on the same PCB. An antenna is mounted somewhere on the radio and is connected to the power amplifier and the transceiver for transmitting and receiving signals.

To improve a radio design, or to move to a higher level of integration, the radio partitioning may be modified. For example, various discrete components may be integrated into one of the integrated circuits. In another example, where a design includes multiple PCBs, modules, or ICs, the design could be modified by moving one or more components from one PCB to another, and perhaps eliminating a PCB, module, or IC.

Typically, when evaluating where to partition a radio, the antenna is rarely considered. The antenna may play an important role in determining the overall radio performance, but the performance and integration of an antenna into a system is commonly not considered until the final stages of design.

SUMMARY OF THE INVENTION

Various apparatuses and methods of the invention are provided for use in wireless communications. In one example, an apparatus includes a chip carrier, a power amplifier, and an antenna integrated as part of the chip carrier. In another embodiment of the invention, an apparatus includes first and second integrated circuits. A transceiver resides on the first integrated circuit. A multi-stage power amplifier resides partially on the first integrated circuit, and partially on the second integrated circuit. In other embodiments of the invention an apparatus includes multiple antennas, which may be used for different frequency bands.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following description illustrates one example of a typical application of the present invention. A radio using techniques of the present invention may be used for any desired application, including for wireless transmission systems such as mobile or cellular communication devices or other wireless devices. A wireless device may include a transceiver, an antenna switch module, a power amplifier, and an antenna. Coupled between the transceiver and the antenna switch module is an RF power amplifier for amplifying signals for transmission via the antenna. In the case of a wireless mobile application, the invention may be applied to GSM, CDMA, PCS, DCS, etc., or any other wireless systems. This is just one example of an application of a radio utilizing the present invention. The invention may also be used in any other application requiring a radio.

Figure 1:
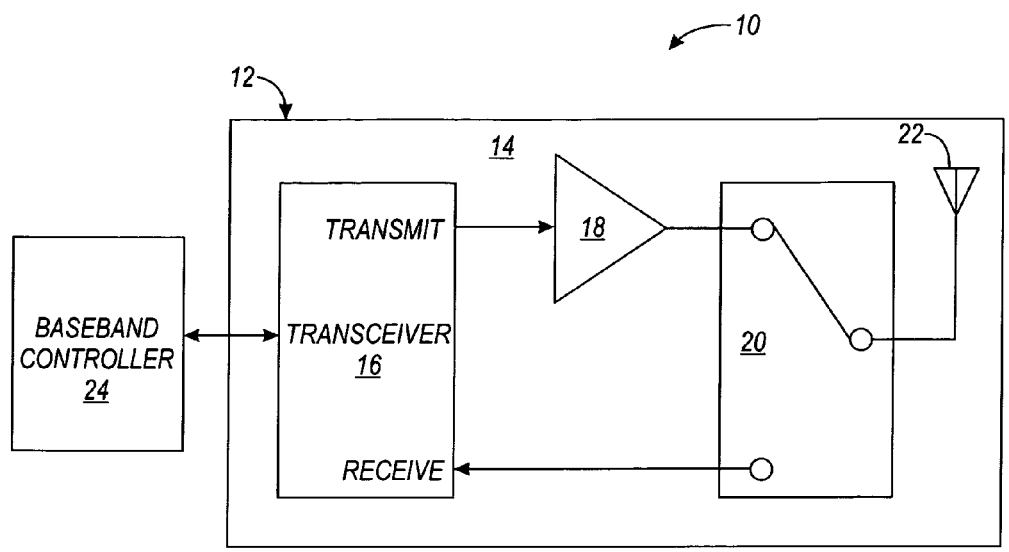
FIG. 1 is a block diagram of a radio implemented using a multi-chip module.

In one example, a radio of the present invention uses a multi-chip module to group some or all of the components of the radio in a single package. FIG. 1 is a block diagram of a radio 10 implemented using a multi-chip module 12. The module 12 includes a chip carrier 14, and various components of the radio, described below. The radio 10 includes a transceiver 16. The transceiver 16 is coupled to a power amplifier 18, which is used to amplify signals to be transmitted by the radio 10. The power amplifier 18 and transceiver 16 are coupled to an antenna switch module 20, which selectively couples an antenna 22 to the power amplifier 18 (for transmitting signals) and to the transceiver 16 (for receiving signals). A baseband controller 24 is coupled to the transceiver 16. The baseband controller controls various aspects of the operation of the radio 10. Note that FIG. 1 merely provides one example of a radio, and that various other radio configurations could also be used. Furthermore, discrete components are not shown, such as SAWs, resistors, capacitors, inductors, etc.

The multi-chip module 12, in this example, includes a chip carrier 14. In one example, the chip carrier 14 is a multi-layer ceramic chip carrier, although other types of carriers could also be used. Examples of suitable types of carriers include, but are not limited to, ceramic, laminate, die paddle, etc. A transceiver 16 resides on a first die (e.g., using CMOS technology), which is mounted to the chip carrier 14. The power amplifier 18, including related power control circuitry, resides on a second die (e.g., using GaAs, SOI, CMOS and/or other technology), which is also mounted to the chip carrier 14. An antenna switch module 20 resides on a third die (e.g., using GaAs, SOI or other technology), which is also mounted to the chip carrier 14. Note that the examples of semiconductor technologies given for each die are merely examples, and that any desired technology, or mix of technologies, for each die can be used. FIG. 1 also shows an antenna 22, as a part of the module 12. In one example, the antenna 22 is integrated in the ceramic substrate of a ceramic chip carrier (such as chip carrier 14). In other examples, an antenna can be mounted on the carrier as a separate component. Other functions of the radio (e.g., switch drivers, etc.) could also be integrated, if desired.

In the example shown in FIG. 1, substantially the entire radio, including a transceiver, a power amplifier (and all associated functions), the antenna switch (and all associated functions), and the antenna, is integrated into a single module. Integrating an entire radio subsystem, and optimizing the critical components to each other, has several advantages. For example, the power amplifier output power and efficiency can be optimized for the insertion loss of the antenna switch module and for the characteristics of the antenna. This optimization allows the current drain on the battery to be minimized. Another advantage is that the specific absorption rate (SAR), harmonics, and noise are minimized. Another advantage relates to power amplifier ramp profiles. Typically, ramp profiles are stored in memory and are selectively used to control the output power of the power amplifier depending on the desired output power level. With the integration of the present invention, the design of ramp profiles is simplified, since the properties of the other components of the module 12 are known. In other less integrated designs, the ramp profiles must be created by the phone manufacturer only after all transmit components are selected. Another advantage of the present invention relates to radio testing. With the radio 10 shown in FIG. 1, the entire radio module can be tested prior to assembly into a phone (or other wireless product) by a user, or even guaranteed to pass type approval, thus lowering the costs for phone manufacturers. With other less integrated designs, the radio can not be tested until each of its' components are assembled.

Figure 2:
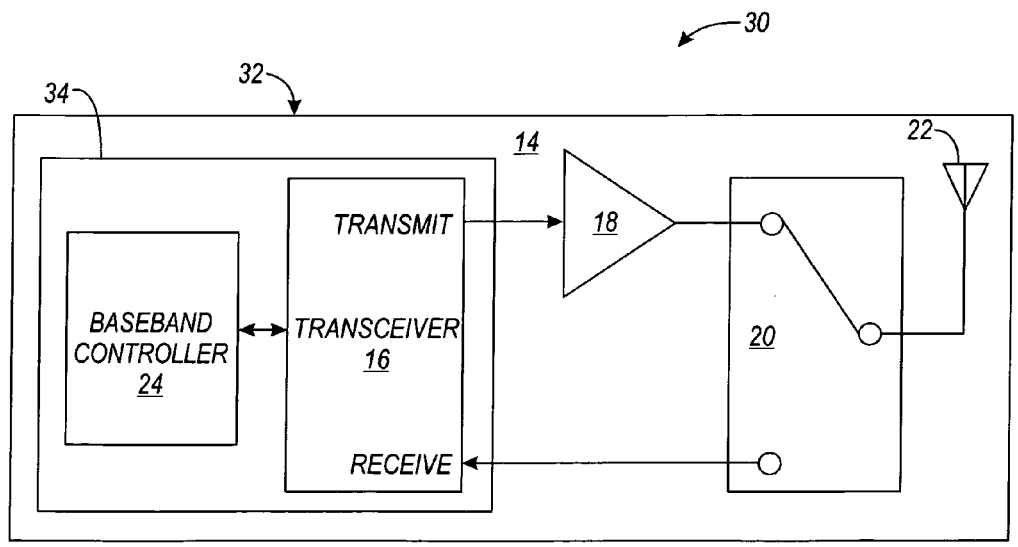
FIG. 2 is a block diagram showing another example of a radio implemented using a multi-chip module.

FIG. 2 is a block diagram showing another example of a radio 30 implemented using a multi-chip module 32. Generally, radio 30 shown in FIG. 2 is the same as the radio 10 shown in FIG. 1, except that the baseband controller 24 resides on the same die (illustrated by the box 34) as the transceiver 16. In this example, the radio is even more integrated than the example shown in FIG. 1.

Like in FIG. 1, the module 32 of FIG. 2 includes a chip carrier 14, and various components of the radio, described below. A transceiver 16 and baseband controller 24 reside on a first die, which is mounted to the chip carrier 14. A power amplifier 18, including related power control circuitry, resides on a second die, which is also mounted to the chip carrier 14. An antenna switch module 20 resides on a third die, which is also mounted to the chip carrier 14. FIG. 2 also shows an antenna 22, as a part of the module 32. In one example, the antenna 22 is integrated in the ceramic substrate of the ceramic chip carrier 14. The radio 30 has all of the advantages of the radio 10 shown in FIG. 1, plus added advantages, as a result of the integration of the baseband controller 24 with the transceiver 16. For example, lower board space, lower power consumption, and other advantages can be realized. The baseband controller can also be integrated into the carrier in the following descriptions.

By partitioning radios in new ways, the present invention can take advantage of various approaches to improve a radio. For example, a component of a radio can be configured in such a way that different parts of the component are integrated into separate integrated circuits to improve the performance, cost, and/or size of the radio.

Figure 3:
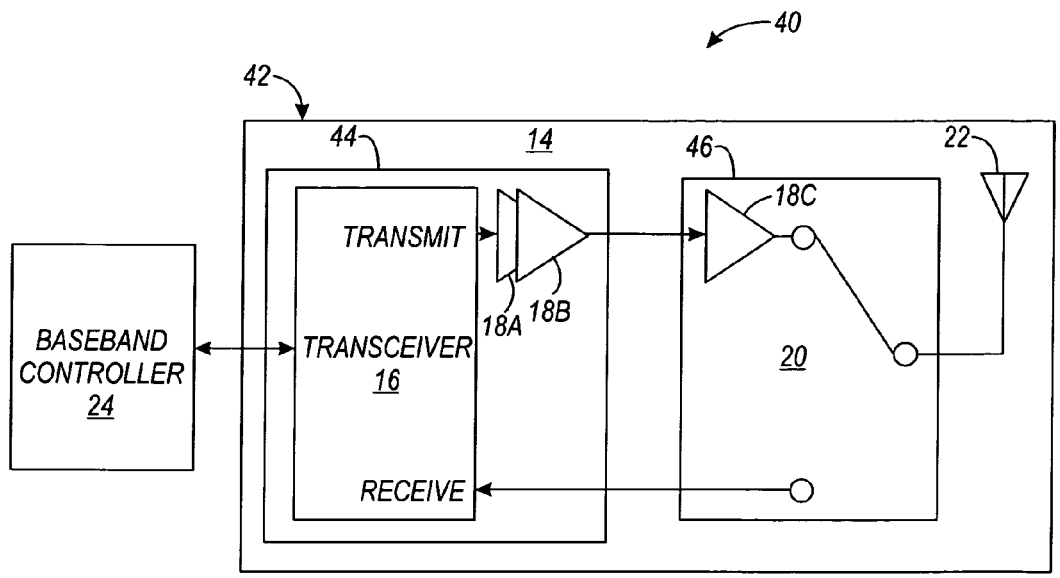
FIG. 3 is a block diagram showing an example of a radio having a power amplifier that is integrated using separate dies.

FIG. 3 is a block diagram showing an example of a radio 40 having a power amplifier that is integrated using separate die. Generally, radio 40 shown in FIG. 3 is the same as the radio 10 shown in FIG. 1, except that the power amplifier is implemented partially in the same die as the transceiver and partially in the same die as the antenna switch module. It is possible to also integrate the baseband controller as part of one die that would include the baseband controller, transceiver, and early power amplifier stages.

The radio 40 is implemented using a multi-chip module 42. Like in FIG. 1, the module 42 of FIG. 3 includes a chip carrier 14, and various components of the radio, described below. In this example, a transceiver 16 resides on a first die 44, which is mounted to the chip carrier 14. An antenna switch module 20 resides on a second die 46, which is also mounted to the chip carrier 14. A multi-stage power amplifier 18 resides on both dies 44 and 46. The example show in FIG. 3 shows a three stage power amplifier, although any desired number of stages may be used. In this example, the first two power amplifier stages 18A and 18B are low power stages, which reside on the die 44, along with the transceiver 16. The final power amplifier stage 18C is a high power stage, which resides on the die 46, along with the antenna switch module 20. FIG. 3 also shows an antenna 22, as a part of the module 14. The antenna 22 may be integrated in the substrate of the chip carrier 14. Note that the integration of the antenna 22 is optional, but, if integrated, would have all of the advantages discussed above with respect to FIGS. 1 and 2. FIG. 3 also shows a baseband controller 24 coupled to the transceiver 16. Note that the baseband controller 24 could also be integrated with the transceiver 16, as is shown in FIG. 2.

The implementation shown in FIG. 3 partitions the radio functions in such a way that leverages the benefits of different process technologies and geometries. The exemplary implementation shown in FIG. 3 assumes that the power amplifier is comprised of multiple amplification stages. In this example, the final stage of the PA generates the greatest power output, and thus requires special architectures and/or special process technology. The earlier power amplifier stages generate less power and could be implemented in standard fine line process technology processes. One advantage of this implementation is the integration and distribution of the power amplifier function into the transceiver die 44 and the switch die 46. In this implementation, the early and low power stages 18A and 18B of the power amplifier, as well as the related power control circuitry, are integrated into the transceiver die 44, while the high power stage 18C of the power amplifier is integrated into the switch die 46. Another benefit is the ability to use special calibration or optimization techniques on the early stages of amplification to provide improvements in performance. The final stages could also be optimized by sending signals back to the transceiver die or baseband to then act on the signals.

In one example, the transceiver die 44 is implemented using CMOS technology (e.g., using 0.13 u CMOS technology), which is appropriate for the early stages of the power amplifier. The switch module die 46 may be implemented using some other technology (e.g., using GaAs, SOI, MEMs, or other technology), which may provide better performance for the final stage of the power amplifier. The implementation illustrated in FIG. 3 has several advantages. For example, the power amplifier functionality is integrated into the transceiver and switch module dies, decreasing the number of dies, compared to the implementations shown in FIGS. 1 and 2. Another advantage is that this implementation allows the final stage of the power amplifier to use a fundamentally more efficient process than CMOS, and thus gets potentially better performance in the final stage than what would be achieved using CMOS technology. Another advantage is that the predominant power consumption and thermal dissipation (temperature increase) is kept off of the same sensitive transceiver die, improving performance overall for the radio. Yet another advantage is that this implementation creates a cost effective solution since only the final stage of the power amplifier and the switch are implemented using higher priced technology (e.g., GaAs, SOI, etc.) while the early power amplifier stages can use the lower cost CMOS technology.

In other examples, a radio can utilize multiple antennas to simplify the radio design, and lead to various advantages. As illustrated above, integrating an antenna with a power amplifier and switch module leads to some advantageous architectures. By increasing the number of antennas to address multi-band applications, the architecture of a radio can be significantly simplified to the point where an antenna switch module may not be necessary. Different antenna configurations will lead to different architectures with different advantages, as discussed below. The following exemplary antenna configurations will be discussed in the context of the 3GPP (GSM) specification, although it is understood that other configurations and other contexts are possible within the scope of the present invention. Furthermore, the concepts presented above are applicable to the implementations described below.

Figure 4:
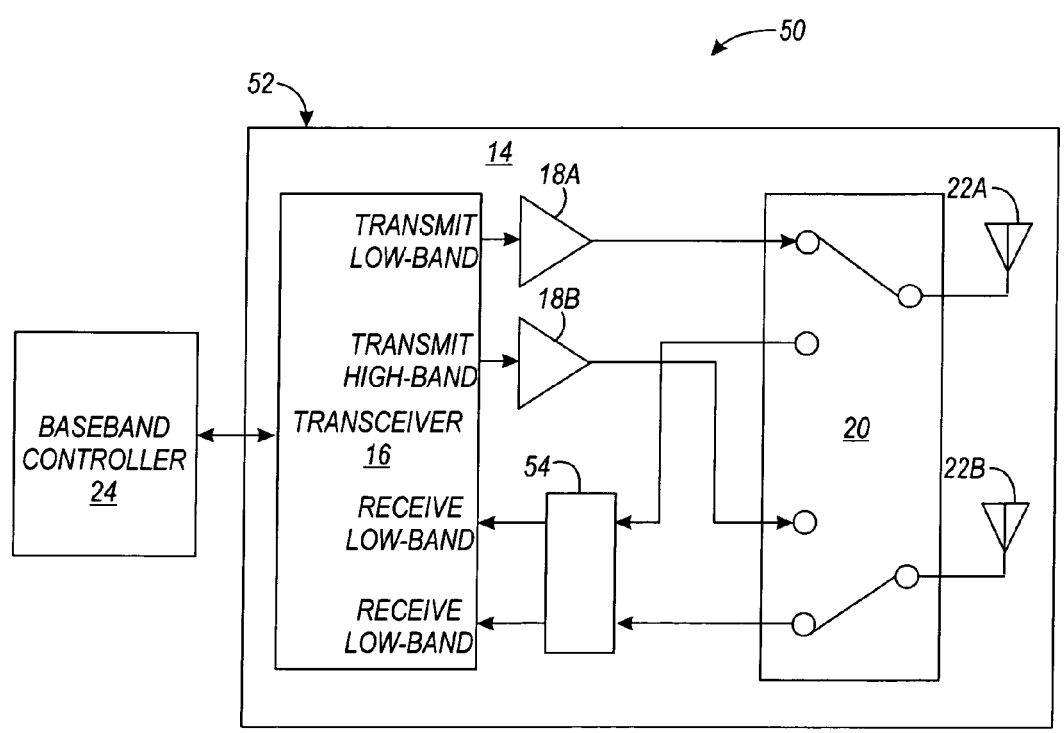
FIG. 4 is a block diagram of the architecture of a radio that uses time division multiplexing for transmission and reception using two antennas.

FIG. 4 is a block diagram of the architecture of a radio in a GSM multi-band system. The radio 50 in FIG. 4 is similar to the radios described above, but with multiple antennas. The radio 50 is implemented using a multi-chip module 52. Like in FIGS. 1, 2, and 3, the module 52 of FIG. 4 includes a chip carrier 14, and various components of the radio, described below. The components of the module 52 reside on one or more dies, which are mounted to the chip carrier 14. In one example, a transceiver 16 resides on a first die, which is mounted to the chip carrier 14. Power amplification is provided by two power amplifiers 18A and 18B. In this example, the power amplifier 18A is used to amplify low-band signals, and the power amplifier 18B is used to amplify high-band signals. The power amplifiers 18A and 18B are each coupled between the transceiver 16 and the antenna switch module 20. In one example, the antenna switch module 20 resides on a second die, which is mounted to the chip carrier 14. The power amplifiers 18A and 18B may reside or a third die (like the power amplifier shown in FIG. 1), or may reside on two or more separate dies (like the power amplifier shown in FIG. 3). Power control circuitry for the power amplifier is not shown, but could be integrated with the transceiver or on a separate chip.

The radio 50 includes a low-band antenna 22A and a high-band antenna 22B. The antennas 22A and 22B may be integrated as a part of the chip carrier 14, as described above, or may be separate from the chip carrier 14. When the radio 50 is operating in a low-band mode, the antenna switch module 20 will couple the low-band power amplifier 18A to the low-band antenna 22A, while transmitting low-band signals. Similarly, when the radio 50 is operating in a high-band mode, the antenna switch module 20 will couple the high-band power amplifier 18B to the high-band antenna 22B, while transmitting high-band signals. When the radio is receiving signals, the antenna switch module 20 couples the appropriate antenna to the transceiver 16, via a filter 54, or similar device. In one example, the filter 54 is a surface-acoustic-wave (SAW) filter. Note that the number of antennas can vary depending on radio system requirements, as desired.

The implementation illustrated in FIG. 4 has several advantages. Typically, an antenna switch module with a single antenna port will include an antenna diplexer to filter signals, as well as to combine the high band and low band paths to the antenna. This is done despite the fact that many standard antenna designs for dual band applications (planar, inverted-F, patch, etc.) naturally have separate feeds available for the two bands. One proposed idea intends to leverage these separate feed connections. One advantage to the implementation illustrated in FIG. 4 is that an antenna diplexer is not required, since the high band and low band paths are already separate. Another advantage to having separate high and low band antennas is that each antenna can be optimized for a narrower frequency band, and for better gain. Another advantage of this implementation is that each antenna can be configured to have a better response to changing loads. Another advantage of this implementation is that improved isolation is achieved when the low-band power amplifier is on and high-band power amplifier is off. This improvement is achieved by having the high-band and low-band antennas physically separated. Further isolation can be achieved by detuning the high-band antenna response to further minimize any leakage of energy from the low-band transmit path to the high-band antenna. Also of note is the reduction in loss for each individual path, since the number of switch poles is reduced for each separate path, resulting in a more efficient system solution.

Note that in all the configurations and implementations discussed above, the antenna switch module can contain a harmonic filter that removes unwanted harmonic content from the output of the power amplifiers. A portion of the insertion loss of a typical antenna switch module is due to the harmonic filter. In the examples that follow, these harmonic filters, and their role in the system, will be discussed in more detail.

Figure 5:
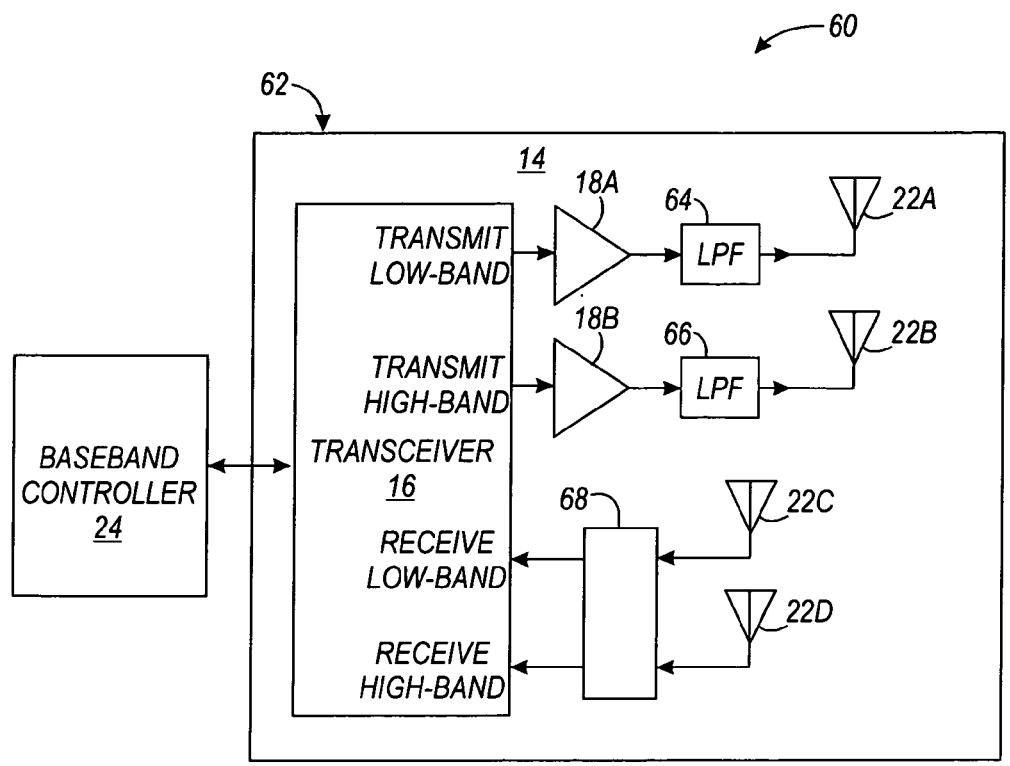
FIG. 5 is a block diagram of the architecture of another exemplary radio using four antennas.

FIG. 5 is a block diagram of the architecture of another exemplary radio 60 in a GSM multi-band system. The radio 60 in FIG. 5 is similar to the radios described above, but with more antennas, and no antenna switch module. The radio 60 is implemented using a multi-chip module 62. Like in other figures, the module 62 of FIG. 5 includes a chip carrier 14, and various components of the radio, described below. The components of the module 62 reside on one or more dies, which are mounted to the chip carrier 14. Similarly, the antennas of the radio 60 may be integrated as a part of the chip carrier, or may be separate. The antennas may be separate antennas, or may have separate electrical connections to a single resonant antenna structure designed to satisfy the signal isolation required. As is described in detail above, the components of the radio 60 can reside on dies in various configurations, as desired.

Power amplification is provided by two power amplifiers 18A and 18B. In this example, the power amplifier 18A is used to amplify low-band signals, and the power amplifier 18B is used to amplify high-band signals. The low-band power amplifier 18A is coupled between the transceiver 16 and a low-band transmit antenna 22A, via low pass filter 64. The high-band power amplifier 18B is coupled between the transceiver 16 and a high-band transmit antenna 22B, via low pass filter 66.

For receiving signals, the radio 60 includes separate low-band and high-band receiving antennas. A low-band receiving antenna 22C is coupled to the transceiver 16 via a filter 68. A high-band receiving antenna 22D is coupled to the transceiver 16 via a filter 68. The filter 68 may be implemented using a SAW filter, band-pass filter, or any other desired type of circuitry. The choice of a particular type of filter may be based on several factors. For example, if rejection or Q of the antenna can be high enough, a band-pass filter may be suitable. Instead of the typical SAW filter, the receive filter can then be formed in the same die as the transceiver 16. Using a band-pass filter could also improve receive sensitivity since a band-pass filter could be made to have a lower insertion loss than a SAW filter.

As shown, the implementation illustrated in FIG. 5 does not require an antenna switch module. In addition, each antenna can be configured in an optimal manner, for its' specified purpose. These features lead to several advantages over other radios. For example, having no antenna switches reduces the insertion loss between the power amplifier the antenna. The lack of antenna switches also can reduce the cost of the module 62. Another advantage of this implementation is that each antenna can be optimized for a narrower frequency band and better gain. Another advantage of this implementation is that the antenna response to changing loads is improved. Another advantage of this implementation is that the receive sensitivity of the receive antennas will be improved since there is less insertion loss as a result of eliminating the antenna switch as well as potentially eliminating the SAW filter. Another advantage of this implementation is that power amplifier output power can be reduced, which increases the efficiency of the radio. Another advantage of this implementation is that the implementation enables optimal matching of each power amplifier to its' associated antenna. This includes the case where the power amplifier implementation or performance may be improved by presenting a custom impedance specific to that particular antenna. This applies similarly for the receive paths as well. This implementation also simplifies the required software used to operate the radio, and increases efficiency of the radio.

One key challenge in designing power amplifier for wireless communications systems, such as a GSM system, is providing good performance across changing loads. Problems can arise when a load mismatch occurs. In a typical implementation, a power amplifier will expect a 50 Ohm antenna load. However, due to various conditions, the PA will rarely operate in an exact 50 Ohm environment. As a result, talk-time and battery life will be dramatically impacted by how well the power amplifier operates under load mismatch conditions. Furthermore, power amplifier designers may spend considerable time and effort stabilizing power amplifiers to operate under non-50 Ohm conditions. Designers typically make design trade-offs that lower the performance of a radio for the sake of stability under load mismatch conditions. By limiting the range of non-50 Ohm antenna loads that a power amplifier has to operate over, the power amplifier performance, and overall radio performance (e.g., talk time and battery life), can be improved.

Figure 6:
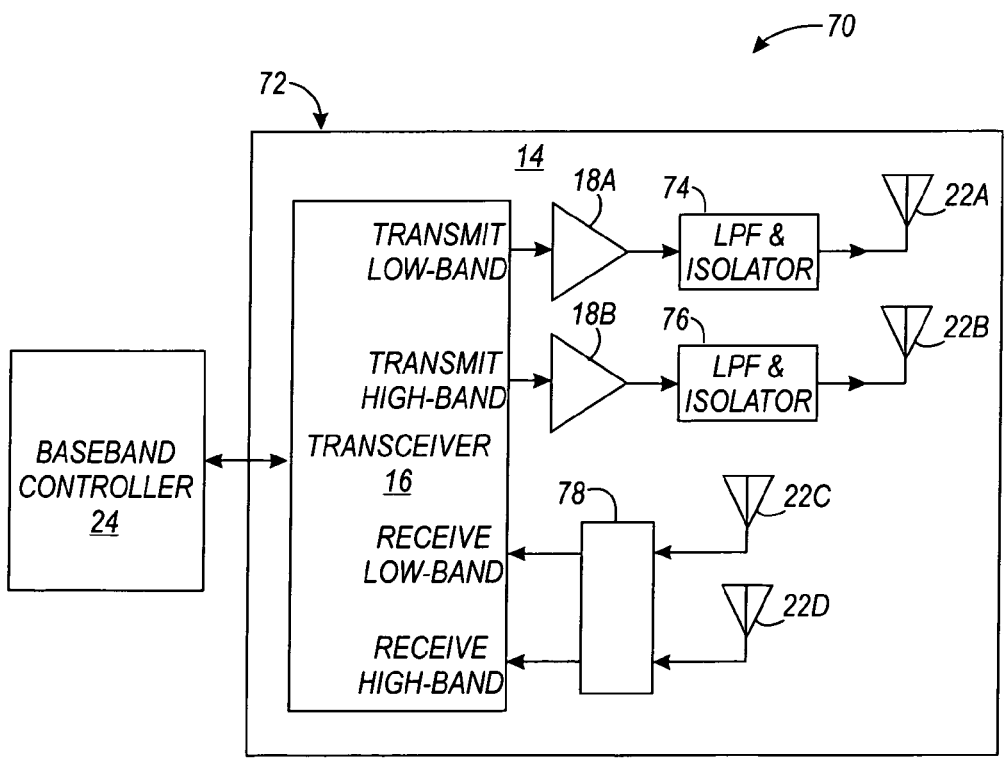
FIG. 6 is a block diagram of the architecture of another exemplary radio using four antennas.

FIG. 6 is a block diagram of the architecture of another exemplary radio 70 in a GSM multi-band system. The radio 70 shown in FIG. 6 is similar to the radio 60 shown in FIG. 5, with the addition of isolators coupled between the power amplifiers and the antennas. Like other examples described above, the radio 70 is implemented using a multi-chip module 72. The module 72 of FIG. 6 includes a chip carrier 14, and various components of the radio, described below. The components of the module 72 reside on one or more dies, which are mounted to the chip carrier 14. Similarly, the antennas of the radio 70 may be integrated as a part of the chip carrier, or may be separate. As is described in detail above, the components of the radio 70 can reside on dies in various configurations, as desired.

Power amplification in the radio 70 is provided by two power amplifiers 18A and 18B. In this example, the power amplifier 18A is used to amplify low-band signals, and the power amplifier 18B is used to amplify high-band signals. The low-band power amplifier 18A is coupled between the transceiver 16 and a low-band transmit antenna 22A, via filter and isolator circuitry 74. The high-band power amplifier 18B is coupled between the transceiver 16 and a high-band transmit antenna 22B, via filter and isolator circuitry 76. The operation of the isolator circuitry 74 and 76 are described below.

For receiving signals, the radio 70 includes separate low-band and high-band receiving antennas. A low-band receiving antenna 22C is coupled to the transceiver 16 via a filter 78. A high-band receiving antenna 22D is also coupled to the transceiver 16 via the filter 78. The filter 78 may be implemented using a SAW filter, band-pass filter, or any other desired type of circuitry. If desired, the filter can be formed in the same die as the transceiver 16.

The isolator circuitry functions to limit the range of loads over which the power amplifier has to operate. RF isolator circuits permit a signal to pass in one direction, while providing high isolation to reflected energy in the reverse direction. In the example shown in FIG. 6, the isolators in the circuitry 74 and 76 will permit signals to pass from the power amplifiers 18A and 18B to the antennas 22A and 22B, but will provide isolation to reflected energy in the reverse direction. Typically, this range limitation is accomplished at the expense of increased insertion loss. A typical insertion loss from an isolator is on the order of 0.5 dB. The circuitry 74 and 76 may be implemented in any desired manner, such as the combination of a SAW filter and isolator, or a low-pass filter and isolator, for example.

In addition to some of the same advantages described above with respect to FIGS. 1-5, the implementation show in FIG. 6 has additional advantages. Radio output power control is simplified since the power amplifiers are essentially driving a known impedance, making an open loop power control method more desirable. This feature could be a significant advantage for WCDMA systems where linearity is important. Another advantage of this implementation is that voltage levels in the power amplifiers could be easily controlled and the power amplifier itself simplified since the power amplifiers are driving a more limited range of load impedances. Likewise, due to the driving of a known load, performance of the power amplifier, in terms of power amplifier efficiency, could be improved.

Figure 7:
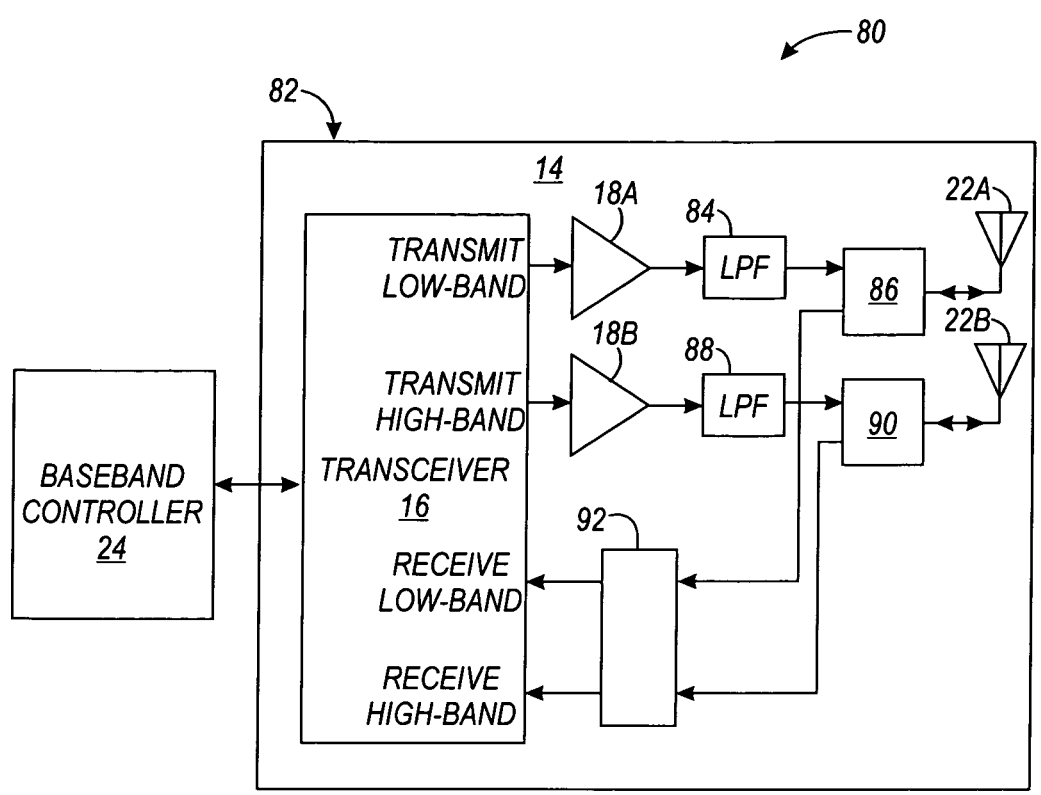
FIG. 7 is a block diagram of the architecture of another exemplary radio using two antennas and circulator circuitry.

One way to reduce the complexity of the implementation described above is by minimizing the number of antennas. One way that this could be achieved by replacing the isolator circuits with circulators. FIG. 7 is a block diagram of the architecture of another exemplary radio 80 in a GSM multi-band system. The radio 80 shown in FIG. 7 is similar to the radio 70 shown in FIG. 6, except that isolator circuitry is replaced with circulators.

Like other examples described above, the radio 80 is implemented using a multi-chip module 82. The module 82 of FIG. 7 includes a chip carrier 14, and various components of the radio, described below. The components of the module 82 reside on one or more dies, which are mounted to the chip carrier 14. Similarly, the antennas of the radio 80 may be integrated as a part of the chip carrier, or may be separate. As is described in detail above, the components of the radio 80 can reside on dies in various configurations, as desired.

Power amplification in the radio 80 is provided by two power amplifiers 18A and 18B. In this example, the power amplifier 18A is used to amplify low-band signals, and the power amplifier 18B is used to amplify high-band signals. The low-band power amplifier 18A is coupled between the transceiver 16 and a low-band antenna 22A, via filter 84 and circulator 86. The high-band power amplifier 18B is coupled between the transceiver 16 and a high-band antenna 22B, via filter 88 and circulator 90. Generally, a circulator allows RF energy to pass in one direction with a small insertion loss, but with high isolation in the opposite direction. In the configuration illustrated in FIG. 7, RF energy (e.g., during radio transmission) is allowed to pass from the power amplifiers 18A and 18B to the antennas 22A and 22B. RF energy received by the antennas 22A and 22B is allowed to pass to the transceiver 16, via the filter circuitry 92. In addition to realizing some of the same advantages described above with respect to FIG. 6, the implementation show in FIG. 7 uses only two antennas. In another example, the circulators 86 and 90 could each be replaced by an isolator followed by a transmit/receive switch.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An RF apparatus used for wireless communications comprising:
    a first integrated circuit;
    a second integrated circuit;
    a transceiver formed on the first integrated circuit; and
    a multi-stage power amplifier electrically coupled to the transceiver, wherein at least one stage of the multi-stage power amplifier is formed on the first integrated circuit and at least one stage of the multi-stage power amplifier is formed on the second integrated circuit.

2. The RF apparatus of claim 1, wherein the multi-stage power amplifier includes a first stage and a final stage, wherein the first stage of the multi-stage power amplifier is formed on the first integrated circuit and the final stage of the multi-stage power amplifier is formed on the second integrated circuit.

3. The RF apparatus of claim 1, further comprising a chip carrier, wherein the first and second integrated circuits are mounted to the chip carrier.

4. The RF apparatus of claim 3, further comprising an antenna electrically coupled to the power amplifier, wherein the antenna is integrated in the chip carrier.

5. The RF apparatus of claim 4, wherein the chip carrier is a ceramic chip carrier.

6. The RE apparatus of claim 1, further comprising a baseband controller electrically coupled to the transceiver.

7. The RF apparatus of claim 6, further comprising an antenna switch module electrically coupled between the power amplifier and the antenna, wherein the antenna switch module is formed on the second integrated circuit.

8. The RF apparatus of claim 1, further comprising:
    a third integrated circuit; and
    an antenna switch module electrically coupled between the multi-stage power amplifier and an antenna, wherein the antenna switch module is formed on the third integrated circuit.

9. A method of providing wireless RF communications comprising:
    forming a transceiver on a first integrated circuit;
    forming a power amplifier at least partially on a second integrated circuit, wherein the power amplifier is electrically coupled to the transceiver;
    mounting the first integrated circuit to a multi-layer chip carrier having a substrate;
    mounting the second integrated circuit to the multi-layer chip carrier; and
    forming an antenna in the substrate of the multi-layer chip carrier, wherein the antenna is electrically coupled to the power amplifier and the transceiver for transmitting and receiving RF signals.

10. The method of claim 9, wherein the chip carrier is a ceramic chip carrier.

11. The method of claim 9, wherein the power amplifier is a multi-stage power amplifier, the method further comprising:
    forming at least one stage of the multi-stage power amplifier on the first integrated circuit and forming at least one stage of the multi-stage power amplifier on the second integrated circuit.

12. The method of claim 9, further comprising forming an antenna switch module on a third integrated circuit, wherein the antenna switch module is electrically coupled between the power amplifier and the antenna.

13. An RF apparatus used for wireless communications comprising:
    a multi-chip module, the multi-chip module further comprising:
        a multi-layer chip carrier having a substrate;
        a first die mounted to the multi-layer chip carrier;
        a second die mounted to the multi-layer chip carrier;
        a power amplifier formed on the first die;
        a transceiver formed on the second die; and
        an antenna electrically coupled to the power amplifier, wherein the antenna is formed in the substrate of the multi-layer chip carrier.

14. The RF apparatus of claim 13, wherein the multi-chip module further comprises an antenna switch module electrically coupled between the power amplifier and the antenna, wherein the antenna switch module is formed on a third die, and wherein the antenna switch module is mounted to the multi-layer chip carrier.

15. The RF apparatus of claim 13, wherein the chip carrier is a ceramic chip carrier.

16. The RF apparatus of claim 13, further comprising a transceiver mounted to the chip carrier.

17. The RF apparatus of claim 16, further comprising a baseband controller electrically coupled to the transceiver.

18. The RE apparatus of claim 16, wherein the transceiver is formed on a second die.

19. The RE apparatus of claim 18, further comprising a baseband controller, wherein the baseband controller is formed on a second die.

20. The RE apparatus of claim 18, further comprising an antenna switch module electrically coupled between the power amplifier and the antenna, wherein the antenna switch module is formed on a third die.

21. The RE apparatus of claim 20, wherein the antenna switch module is mounted to the chip carrier.

22. The RF apparatus of claim 13, further comprising an antenna switch module electrically coupled between the power amplifier and the antenna.

* * * * *

UNITED STATES PATENT AND TRADEMARK OFFICE
CERTIFICATE OF CORRECTION

PATENT NO.          : 8,467,827 B2
APPLICATION NO.     : 11/096255
DATED               : June 18, 2013
INVENTOR(S)         : Mendy M. Ouzillou Page 1 of 1

It is certified that error appears in the above-identified patent and that said Letters Patent is hereby corrected as shown below:

In the Claims

Col. 10, Line 44, Claim 18:
DELETE before apparatus "RE"
ADD before apparatus --RF--

Col. 10, Line 46, Claim 19:
DELETE before apparatus "RE"
ADD before apparatus --RF--

Col. 10, Line 49, Claim 20:
DELETE before apparatus "RE"
ADD before apparatus --RF--

Col. 10, Line 53, Claim 21:
DELETE before apparatus "RE"
ADD before apparatus --RF--

Signed and Sealed this
Thirtieth Day of July, 2013

Teresa Stanek Rea
*Acting Director of the United States Patent and Trademark Office*